US008569102B2

(12) United States Patent
Ahn et al.

(10) Patent No.: US 8,569,102 B2
(45) Date of Patent: Oct. 29, 2013

(54) METHOD OF MANUFACTURING HIGH DENSITY CIS THIN FILM FOR SOLAR CELL AND METHOD OF MANUFACTURING THIN FILM SOLAR CELL USING THE SAME

(75) Inventors: Se-Jin Ahn, Daejeon (KR); Jae-Ho Yun, Daejeon (KR); Ji-Hye Gwak, Daejeon (KR); Ara Cho, Seoul (KR); Kyung-Hoon Yoon, Daejeon (KR); Kee-Shik Shin, Daejeon (KR); Seoung-Kyu Ahn, Daejeon (KR); Ki-Bong Song, Daejeon (KR)

(73) Assignee: Korea Institute of Energy Research, Deajeon (KR)

( * ) Notice: Subject to any disclaimer, the term of this patent is extended or adjusted under 35 U.S.C. 154(b) by 0 days.

(21) Appl. No.: 13/695,627

(22) PCT Filed: Jul. 19, 2011

(86) PCT No.: PCT/KR2011/005306
§ 371 (c)(1),
(2), (4) Date: Nov. 1, 2012

(87) PCT Pub. No.: WO2012/011723
PCT Pub. Date: Jan. 26, 2012

(65) Prior Publication Data
US 2013/0045565 A1    Feb. 21, 2013

(30) Foreign Application Priority Data

Jul. 20, 2010    (KR) .................. 10-2010-0069923

(51) Int. Cl.
*H01L 21/00*    (2006.01)
*C25D 21/12*    (2006.01)
*C01B 19/04*    (2006.01)

(52) U.S. Cl.
USPC    438/95; 205/84; 257/E21.114; 257/E31.027; 423/509

(58) Field of Classification Search
USPC ........................ 438/95; 205/84; 423/509
See application file for complete search history.

(56) References Cited

U.S. PATENT DOCUMENTS 6,126,740 A * 10/2000 Schulz et al. ............. 117/4
7,273,539 B2 * 9/2007 Taunier et al. ............ 205/238
(Continued)

FOREIGN PATENT DOCUMENTS

JP    10-150212    6/1998
JP    10-219472    8/1998
(Continued)

OTHER PUBLICATIONS

International Search Report for corresponding patent application No. PCT/KR2011/005306 dated Mar. 16, 2012.
Written Opinion for corresponding patent application No. PCT/KR2011/005306 dated Mar. 16, 2012.

*Primary Examiner* — Charles Garber
*Assistant Examiner* — Ron Pompey
(74) *Attorney, Agent, or Firm* — Renner, Otto, Boisselle & Sklar, LLP

(57) ABSTRACT

Disclosed are a high density CIS thin film and a method of manufacturing the same, which includes coating CIS nanopowders, CIGS nanopowders or CZTS nanopowders on a substrate by non-vacuum coating, followed by heat treatment with cavities between the nanopowders filled with filling elements such as copper, indium, gallium, zinc, tin, and the like. The high density CIS thin film is applied to a photoabsorption layer of a thin film solar cell, thereby providing a highly efficient thin film solar cell.

12 Claims, 1 Drawing Sheet

(56) References Cited

U.S. PATENT DOCUMENTS

| | | | |
|---|---|---|---|
| 8,236,599 B2 * | 8/2012 | Chang et al. | 438/72 |
| 2004/0206390 A1 * | 10/2004 | Bhattacharya | 136/262 |
| 2006/0263922 A1 * | 11/2006 | Levitsky et al. | 438/48 |
| 2007/0151862 A1 * | 7/2007 | Dobson et al. | 205/220 |
| 2009/0242033 A1 * | 10/2009 | Yoon et al. | 136/264 |
| 2010/0003187 A1 * | 1/2010 | Guo et al. | 423/509 |
| 2010/0261304 A1 * | 10/2010 | Chang et al. | 438/72 |

FOREIGN PATENT DOCUMENTS

| | | |
|---|---|---|
| KR | 10-2009-0029495 | 3/2009 |
| KR | 10-2011-0060211 | 6/2011 |
| KR | 10-2011-0065596 | 6/2011 |
| KR | 10-1075873 | 10/2011 |

* cited by examiner ic
METHOD OF MANUFACTURING HIGH DENSITY CIS THIN FILM FOR SOLAR CELL AND METHOD OF MANUFACTURING THIN FILM SOLAR CELL USING THE SAME This application is a national phase of International Application No. PCT/KR2011/005306 filed Jul. 19, 2011 and published in the English language.

TECHNICAL FIELD

The present invention relates to a method of manufacturing a high density CIS thin film for a solar cell and a method of manufacturing a thin film solar cell using the CIS thin film. More particularly, the present invention relates to a method of manufacturing a high density CIS thin film for a solar cell by coating CIS nanopowders, CIGS nanopowders or CZTS nanopowders on a substrate via non-vacuum coating, followed by heat treatment with cavities between the nanopowders filled with filling elements such as copper, indium, gallium, zinc, tin, and the like, and a method of manufacturing a thin film solar cell using the CIS thin film.

BACKGROUND ART

Recently, development of next generation clean energy sources has become a crucial issue to overcome severe environmental contamination and depletion of fossil fuels. In particular, solar cells directly converting sunlight into electric energy have various merits such as avoidance of contamination, infinite resource and semi-permanent lifespan, and are thus anticipated as an energy source capable of solving the problem of energy depletion.

Solar cells are classified into five types depending on materials for a photo-absorption layer, and a silicon solar cell is most widely used in the art. Recently, however, a rapid increase in raw material costs due to undersupply of silicon has led to increasing interest in thin film solar cells. Thin film solar cells are manufactured to a low thickness, thereby providing merits such as low consumption of material, light weight, wide application ranges, and the like. As for materials of such a thin film solar cell, studies have been actively conducted on amorphous silicon, CdTe, CIS, CIGS, and the like.

A CIS or CIGS thin film is aI-III-VI compound semiconductor and has a higher conversion efficiency of about 19.9% than any other thin film solar cells. In particular, since the CIS or CIGS thin film can be formed to a thickness of 10 micrometers or less and is stable after long term use, the thin film is anticipated as an inexpensive, highly efficient solar cell capable of replacing silicon.

Particularly, the CIS thin film is a direct transition type semiconductor and may be formed into a thin film. Further, the CIS thin film has a band-gap energy of 1.04 eV suited to photo conversion and exhibits a higher coefficient of photo absorption than any other solar cell materials known in the art.

The CIGS thin film is developed to replace some of indium In by gallium Ga or replace selenium Se by sulfur S to improve a low open circuit voltage of the CIS thin film.

Generally, a CIGS solar cell is formed using a thin film having a thickness of several micrometers by vacuum deposition, or by precursor deposition in a non-vacuum state and heat treatment of the precursor-deposited thin film. Vacuum deposition is advantageous in that it provides a highly efficient absorption layer. However, vacuum deposition disadvantageously provides low uniformity and requires expensive equipment in forming a large area absorption layer, and causes material loss of about 20% to 50%, which leads to high manufacturing costs. On the other hand, formation of the solar cell through a non-vacuum precursor deposition and heat treatment at high temperature may advantageously reduce manufacturing costs while providing a uniform large area. However, this process is disadvantageous due to low efficiency of the absorption layer.

Since the CIGS thin film formed by depositing a precursor in a non-vacuum state has lots of pores and exhibits non-dense characteristics, selenization heat treatment is performed. Here, since conventional selenization heat treatment is performed using toxic hydrogen selenide ($H_2Se$) gas, huge installation costs are required to provide a safety system to guarantee safety and the heat treatment is performed for a long duration, thereby causing an increase in the unit cost of the CIGS thin film.

Further, since the CIGS thin film has very high melting point of 1000° C. or more, it is difficult even for CIGS particles having a size of dozens of nanometers to allow particle growth and densification through post-heat treatment.

The inventors of the present invention carried out diligent studies to obtain a method of manufacturing a high density CIS thin film, CIGS thin film or CZTS thin film through non-vacuum coating. As a result, the inventors found that a high density CIS thin film can be formed when heat treating the CIS thin film, CIGS thin film, CZTS thin film, with cavities of the film filled with filling elements such as copper, indium, gallium, zinc, tin, and the like. Accordingly, it was also found that, when such a high density CIS thin film was applied to a photo-absorption layer of a thin film solar cell, it is possible to improve efficiency of the thin film solar cell while reducing manufacturing costs thereof.

DISCLOSURE OF INVENTION

Technical Problem

The present invention was conceived to solve the problems of the related art, and one aspect of the present invention is to provide a high density CIS thin film, which can reduce manufacturing costs using non-vacuum coating, and a method of manufacturing the same.

Another aspect of the present invention is to provide an inexpensive thin film solar cell, which has high efficiency, and a method of manufacturing the same.

Solution to Problem

In accordance with one aspect of the invention, a method of manufacturing a high density CIS thin film includes: preparing CIS nanoparticles (Step 1); dispersing the CIS nanoparticles and dissolving a binder in a solvent to prepare a CIS slurry (Step 2); dissolving a filling element-containing salt and a binder in a solvent to prepare a filling element-containing slurry (Step 3); mixing the CIS slurry and the filling element-containing slurry to prepare a slurry mixture (Step 4); and coating the slurry mixture onto a substrate to form a CIS thin film, followed by heat treatment (Step 5).

In accordance with another aspect of the present invention, a method of manufacturing a high density CIS thin film include: preparing CIS nanoparticles (Step A); dispersing the CIS nanoparticles and dissolving a binder in a solvent to prepare a CIS slurry (Step B); coating the CIS slurry onto a substrate to form a CIS thin film (Step C); dissolving a filling element-containing salt and a binder in a solvent to prepare a filling element-containing slurry (Step D); and coating the filling element-containing slurry onto the CIS thin film, followed by heat treatment (Step E).

In one exemplary embodiment, the CIS nanoparticles may include CIS nanoparticles, CIGS nanoparticles, or CZTS nanoparticles.

The filling element-containing salt may be a mixed salt of at least two selected from the group consisting of copper salt, indium salt, gallium salt, zinc salt, and tin salt.

In another exemplary embodiment, the filling element-containing slurry may further include a selenium compound.

In one exemplary embodiment, the CIS thin film may be formed by non-vacuum coating including spraying, ultrasonic spraying, spin coating, doctor blade coating, screen printing, and inkjet printing.

In another exemplary embodiment, the heat treatment is selenization heat treatment performed at 400 to 550° C. while supplying Se vapor. The selenization heat treatment may make the CIS thin film denser.

A further aspect of the present invention provides a high density CIS thin film, which includes a CIS thin film; and filling elements placed in cavities within the CIS thin film. Here, the filling elements are at least two elements selected from the group consisting of copper, indium, gallium, zinc, and tin.

The CIS thin film may be a CIS thin film, a CIGS thin film, or a CZTS thin film.

Advantageous Effects of Invention

According to the exemplary embodiments, the CIS thin film is subjected to heat treatment with cavities of the CIS thin film filled with filling elements such as copper, indium, gallium, zinc, tin, and so on, thereby forming a high density CIS thin film. When the high density CIS thin film is applied to a photo-absorption layer of a thin film solar cell, the manufactured thin film solar cell exhibits high efficiency.

BEST MODE FOR CARRYING OUT THE INVENTION

Figure 1:
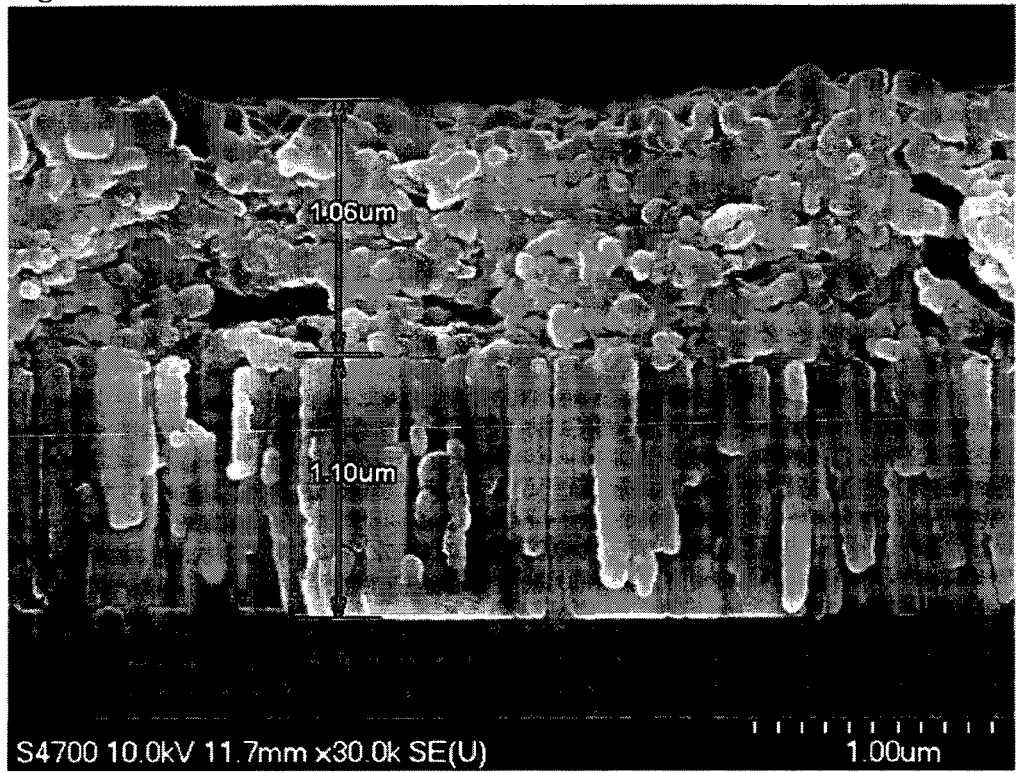
FIG. 1 is a scanning electronic microscope (SEM) image of a side section of a CIGS thin film manufactured according to Example 2.

Exemplary embodiments of the present invention will be described in detail with reference to the accompanying drawings.

According to the present invention, there are two methods of manufacturing a high density CIS thin film by filling cavities of a CIS thin film with filling elements such as copper, indium, gallium, zinc, tin, and the like.

In one method according to the present invention, a slurry containing CIS nanoparticles is mixed with a metal salt including copper, indium, gallium, zinc, tin, and the like to prepare a slurry mixture, which is coated onto a substrate, followed by heat treatment, thereby providing a high density CIS thin film. Next, the method according to the present invention will be described in more detail.

First, the CIS nanoparticles are prepared in Step 1.

Herein, the term "CIS" means Cu—In—Se-based ternary compounds, which are IB-IIIA-VIA group compound semiconductors, such as Cu—In—S, Cu—Ga—S, Cu—Ga—Se, and the like; quaternary compounds such as Cu—In—Ga—Se; and quinary-hexanary compounds such as Cu—In—Ga—Se—(S,Se), Cu—In—Al—Ga—(S,Se), Cu—In—Al—Ga—Se—S, and the like. More broadly, the term "CIS" means CZTS-based compounds such as Cu—Zn—Sn—(Se, S), Cu—In—Ga—Zn—Sn—(Se,S), etc. Here, Cu—Zn—Sn—(Se,S) is formed by substituting all IIIA-group elements such as In, Ga, Al, and the like in the CIS with IIB-group elements (Zn and the like) and IVA-group elements (Sn and the like). Further, Cu—In—Ga—Zn—Sn—(Se,S) is formed by substituting some of the IIIA-group elements in the CIS with the IIB-group elements and the IVA-group elements.

The CIS nanoparticles may be prepared by any known method in the art, such as a low temperature colloidal process, a solvent thermal process, or a microwave process, using the CIS.

Next, the CIS nanoparticles and a binder are dispersed and dissolved, respectively, in a solvent to prepare a CIS slurry in Step 2.

In one exemplary embodiment, the solvent may be an alcohol-based solvent such as methanol, ethanol, phentanol, propanol, butanol, and the like.

The binder may be ethylene glycol, propylene glycol, ethyl cellulose, polyvinylpyrrolidone, and the like. The amount of binder may be adjusted to control the concentration of the CIS slurry.

The CIS slurry may include 20 to 30 parts by weight of the CIS nanoparticles, 80 to 100 parts by weight of the solvent, and 20 to 30 parts by weight of the binder.

The CIS nanoparticles and the binder are sufficiently mixed in the solvent, followed by ultrasonic treatment, so that the prepared CIS slurry is uniformly dispersed.

Next, a filling element-containing salt and a binder are dissolved in a solvent to prepare a filling element-containing slurry (Step 3).

Herein, the term "filling element" means elements to be placed in cavities of the CIS thin film. For a CIS thin film, the filling element may include copper and indium, and for a CIGS thin film, the filling element may include copper and indium or gallium. For a CZTS thin film, the filling element may include copper, zinc or tin.

The aforementioned filling element-containing salt, for example, a mixed salt of at least two selected from the group consisting of copper salt, indium salt, gallium salt, zinc salt and tin salt, is mixed with a binder in a solvent, thereby preparing the filling element-containing slurry.

The binder and solvent used for preparing the filling element-containing slurry may be the same as those used in preparation of the CIS slurry.

The filling element-containing slurry may include 10 to 20 parts by weight of the filling element-containing salt, 80 to 90 parts by weight of the solvent, and 20 to 30 parts by weight of the binder.

In the filling element-containing slurry according to one exemplary embodiment, the copper salt may include CuCl, Cu-acetate, CuI, $CuSO_4$, and the like; the indium salt may include $In(NO_3)_3$, $In_2(SO_4)_3$, In-acetate, and the like; the gallium salt may include $GaCl_3$, $GaI_3$, $Ga(NO_3)_3$, Ga-acetate, and the like; the zinc salt may include $ZnCl_2$, $Zn(NO_3)_2$, $ZnI_2$, and the like; and the tin salt may include $SnCl_4$ and the like.

In another exemplary embodiment, the filling element-containing slurry may further include a selenium compound such as $SeO_2$, $SeCl_4$, selenourea, and the like.

Next, the CIS slurry is mixed with the filling element-containing slurry to prepare a slurry mixture in Step 4.

Next, the slurry mixture is coated onto a substrate to form a CIS thin film, which in turn is subjected to heat treatment, in Step 5.

In this invention, when forming the CIS thin film using the slurry mixture, non-vacuum coating is employed. The non-vacuum coating may be any non-vacuum coating method known in the art, for example, spraying, ultrasonic spraying, spin coating, doctor blade coating, screen printing, inkjet printing, and the like. As such, the CIS thin film may be formed by non-vacuum coating, thereby reducing manufacturing costs.

After forming the CIS thin film by coating the slurry mixture in a non-vacuum state, the thin film may be further subjected to drying to remove the alcohol solvent and the binder. Coating of the slurry mixture and drying are repeated twice or three times, thereby forming a CIS thin film having a desired thickness.

Then, the CIS thin film is subjected to heat treatment. In this embodiment, heat treatment of the CIS thin film is performed at 400 to 550° C., which is lower than the temperature of existing post-heat treatment for CIS thin films, while supplying Se vapor, thereby providing a dense CIS thin film.

In the process of heat treating the thin film while supplying the Se vapor, Se vapor formed by heating Se solid to evaporate the Se solid is supplied. This process can be easily performed by those skilled in the art.

In another method according to the present invention, a slurry containing CIS nanoparticles is prepared and coated onto a substrate to form a CIS thin film. Then, a slurry containing metal salts including copper, indium, gallium, zinc, tin, and the like is prepared and coated onto the CIS thin film, which in turn is subjected to heat treatment, thereby preparing a dense CIS thin film. Next, the method according to the present invention will be described in more detail.

As in Steps 1 and 2 of the method described above, CIS nanoparticles are prepared and dispersed together with a binder in a solvent to prepare a CIS slurry in Steps A and B.

Next, the prepared CIS slurry is coated onto a substrate to form a CIS thin film in Step C.

Here, the CIS slurry is coated onto the substrate by non-vacuum coating.

Next, a filling element-containing salt and a binder are dissolved in a solvent to prepare a filling element-containing slurry in Step D.

The method of preparing the filling element-containing slurry is the same as the method described above.

Then, a filling element-containing slurry is coated onto the CIS thin film, followed by heat treatment in Step E.

The CIS thin film formed on the substrate has lots of cavities. Thus, when the filling element-containing slurry is coated thereon, filling elements such as copper, indium, gallium, zinc, tin, and the like enter the cavities, thereby making it possible to form a dense CIS thin film.

Next, the CIS thin film having the filling elements placed in the cavities is subjected to heat treatment, thereby forming a higher density CIS thin film.

A CIS thin film manufactured by the method according to this invention has a dense structure through heat treatment of the CIS thin film with the cavities of the thin film filled with the filling elements, as described above.

Further, the present invention provides a thin film solar cell, a photo-absorption layer of which is a high density CIS thin film obtained through heat treatment of the CIS thin film with the cavities of the CIS thin film filled with the filling element.

Further, the present invention provides a method of manufacturing a thin film solar cell using the CIS thin film according to the embodiments of the invention.

Example 1

In a glove box, 0.343 g of CuI and 0.991 g of InI3 were mixed with 30 ml of a distilled pyridine solvent, followed by stirring for 10 minutes. After stirring for about 10 minutes, the opaque solution became transparent. Then, the mixture of Cu and In was mixed with 0.5 g of $Na_2Se$ dissolved in 20 ml of distilled methanol. The resultant has an atomic ratio of Cu:In:Se of 0.9:1:2. Then, the mixture of methanol/pyridine was reacted for 1 minute while being mechanically stirred in an ice bath at 0° C., thereby preparing CIGS nanoparticles. The prepared CIGS colloid was subjected to centrifugation for about 30 minutes at 4000 rpm and ultrasonic treatment for 5 minutes, followed by washing with distilled methanol. This process was repeated to completely remove by-products and pyridine, thereby preparing highly pure CIS nanoparticles.

0.3 g of the prepared CIS nanoparticles and 0.3 g of propylene glycol was dissolved in 1.2 g of methanol, followed by ultrasonic treatment for 60 minutes, thereby preparing a CIS slurry. Then, 0.15 g of $Cu(NO_3)_2$, 0.184 g of $InCl_3$, and 2 ml of propylene glycol were mixed in 8 ml of ethanol, and stirred for 60 minutes, thereby preparing a filling element-containing slurry. The CIS slurry was mixed with the filling element-containing slurry, followed by ultrasonic treatment for 60 minutes, thereby preparing a slurry mixture. The prepared slurry mixture was coated onto a glass substrate by doctor blade coating, followed by drying the substrate at 60° C. for 5 minutes and at 180° C. for 2 minutes on a hot plate to remove the alcohol solvent and the binder. Such a coating and drying process was repeated three times to form a CIS thin film on the substrate. Then, the film was subjected to heat treatment while supplying Se vapor at a substrate temperature of 400° C., thereby preparing a high density CIS thin film.

Example 2

CIS nanoparticles were prepared by the same process as in Example 1. Then, 0.3 g of the prepared CIS nanoparticles and 0.3 g of propylene glycol was dissolved in 1.2 g of methanol, followed by ultrasonic treatment for 60 minutes, thereby preparing a CIS slurry. The CIS slurry was coated onto a glass substrate by doctor blade coating, followed by drying the substrate at 60° C. for 5 minutes and at 180° C. for 2 minutes on a hot plate to remove the alcohol solvent and the binder. Such a coating and drying process was repeated three times to form a CIS thin film on the substrate. Then, 0.15 g of $Cu(NO_3)_2$, 0.184 g of $InCl_3$, and 2 ml of propylene glycol were mixed in 8 ml of ethanol, and stirred for 60 minutes, thereby preparing a filling element-containing slurry, which in turn was coated onto the CIS thin film, followed by drying the thin film at 60° C. for 5 minutes and at 180° C. for 2 minutes on a hot plate to remove the alcohol solvent and the binder. Then, the thin film was subjected to heat treatment while supplying Se vapor at a substrate temperature of 400° C., thereby preparing a high density CIS thin film. FIG. 1 is a scanning electronic micrograph (SEM) image of a side section of the CIS thin film manufactured according to Example 2.

Comparative Example 1

Figure 2:
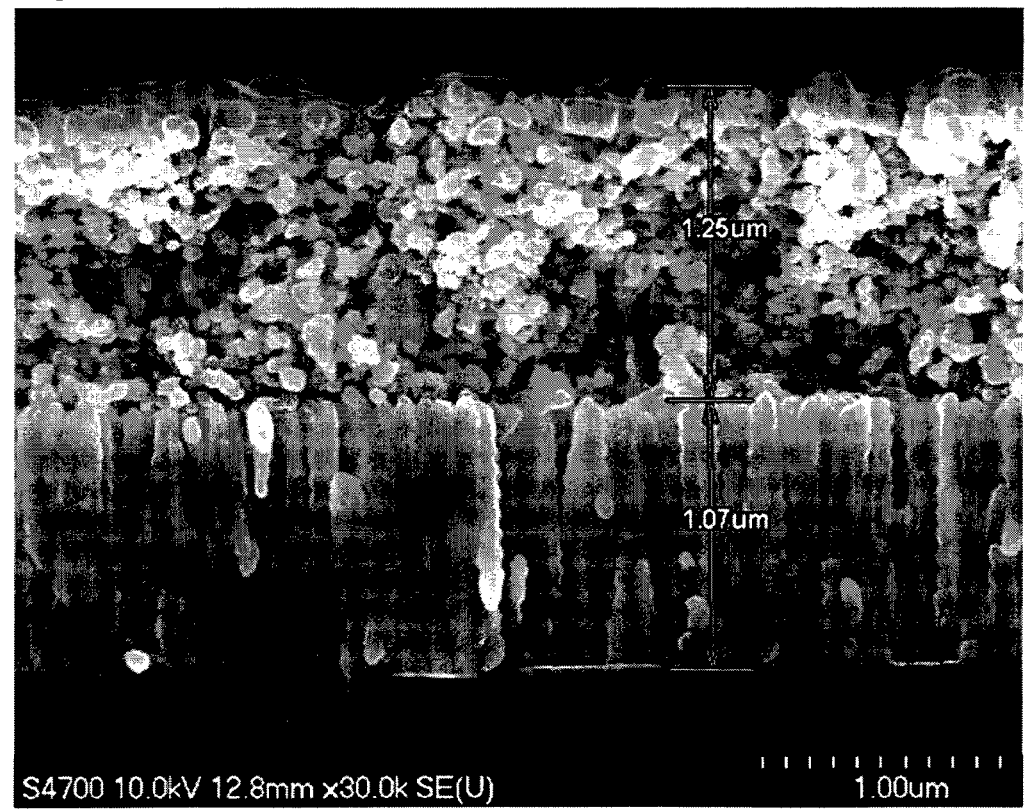
FIG. 2 is a SEM image of a side section of a CIGS thin film manufactured according to Comparative Example 2.

CIS nanoparticles were prepared by the same process as in Example 1. Then, 0.3 g of the prepared CIS nanoparticles and 0.3 g of propylene glycol were dissolved in 1.2 g of methanol, followed by ultrasonic treatment for 60 minutes, thereby preparing a CIS slurry. The CIS slurry was coated onto a glass substrate by doctor blade coating, followed by drying the substrate at 60° C. for 5 minutes and at 180° C. for 2 minutes on a hot plate to remove the alcohol solvent and the binder. Such a coating and drying process was repeated three times to form a CIS thin film on the substrate. FIG. 2 is an SEM image of a side section of the CIS thin film manufactured according to Comparative Example 2.

Referring to FIGS. 1 and 2, it can be seen that the CIS thin film prepared in Example 2 is denser than the CIS thin film prepared in Comparative Example 1 in which the filling element-containing slurry was not coated to the thin film. Therefore, it can be seen that the CIS thin film formed by the method according to the present invention has a denser structure even when the thin film is subjected to heat treatment at a lower temperature than that of existing heat treatment.

Although some embodiments have been described herein, it should be understood by those skilled in the art that these embodiments are given by way of illustration only, and that various modifications, variations, and alterations can be made without departing from the spirit and scope of the invention. Therefore, the scope of the invention should not be limited only by the accompanying claims and equivalents thereof.

The invention claimed is:

1. A method of manufacturing a high density CIS thin film, comprising:
preparing CIS nanoparticles;
dispersing the CIS nanoparticles and dissolving a binder in a solvent to prepare CIS slurry;
dissolving a filling element-containing salt and a binder in a solvent to prepare a filling element-containing slurry, wherein the filling element-containing salt is a mixed salt of at least two selected from the group consisting of copper salt, indium salt, gallium salt, zinc salt, and tin salt;
mixing the CIS slurry and the filling element-containing slurry to prepare a slurry mixture; and
coating the slurry mixture onto a substrate to form a CIS thin film, followed by heat treatment.

2. The method of claim 1, wherein the CIS nanoparticles comprise CIS nanoparticles, CICS nanoparticles, or CZTS nanoparticles.

3. The method of claim 1, wherein the filling element-containing slurry further comprises a selenium compound.

4. The method of claim 3, wherein the selenium compound is selected from the group consisting of $SeO_2$, $SeCl_4$, and selenourea.

5. The method of claim 1, wherein the copper salt is selected from the group consisting of CuCl, Cu-acetate, CuI, and $CuSO_4$.

6. The method of claim 1, wherein the indium salt is selected from the group consisting of $In(NO_3)_3$, $In_2(SO_4)_3$, and In-acetate.

7. The method of claim 1, wherein the gallium salt is selected from the group consisting of $GaCl_3$, $GaI_3$, $Ga(NO_3)_3$ and Ga-acetate, the zinc salt is selected from the group consisting of $ZnCl_2$, $Zn(NO_3)_2$ and $ZnI_2$, and the tin salt is $SnCl_4$.

8. The method of claim 1, wherein the solvent is an alcohol-based solvent including methanol, ethanol, phentanol, propanol, and butanol.

9. The method of claim 1, wherein the binder is selected from the group consisting of ethylene glycol, propylene glycol, ethyl cellulose, and polyvinylpyrrolidone.

10. The method of claim 1, wherein the CIS thin film is formed by non-vacuum coating selected from the group consisting of spraying, ultrasonic spraying, spin coating, doctor blade coating, screen printing, and inkjet printing.

11. The method of claim 1, further comprising:
drying the CIS thin film after forming the CIS thin film and before the heat treatment.

12. The method of claim 1, wherein the heat treatment is selenization heat treatment performed at 400 to 550° C. while supplying Se vapor.

* * * * *